United States Patent
Hsu et al.

(10) Patent No.: US 7,807,264 B2
(45) Date of Patent: Oct. 5, 2010

(54) ELECTROMAGNETIC WAVE ABSORPTION MATERIAL AND MANUFACTURING METHOD THEREOF

(75) Inventors: Jen-Sung Hsu, Taipei (TW); Tzu-Hao Ting, Tainan County (TW); Kao-Hui Wu, Taoyuan County (TW); Ming-Ho Chang, Taoyuan County (TW)

(73) Assignee: Chung Shan Institute of Science and Technology, Armaments Bureau, M.N.D., Taoyuan County (TW)

( * ) Notice: Subject to any disclaimer, the term of this patent is extended or adjusted under 35 U.S.C. 154(b) by 419 days.

(21) Appl. No.: 11/857,642

(22) Filed: Sep. 19, 2007

(65) Prior Publication Data

US 2009/0072186 A1   Mar. 19, 2009

(51) Int. Cl.
*B32B 25/02* (2006.01)
*C08K 3/00* (2006.01)
*C08K 5/00* (2006.01)

(52) U.S. Cl. .................. 428/323; 428/220; 524/495

(58) Field of Classification Search .................. None
See application file for complete search history.

(56) References Cited

FOREIGN PATENT DOCUMENTS

| | | | |
|---|---|---|---|
| JP | 2001-189590 A | * | 7/2001 |
| JP | 2001-331181 A | * | 11/2001 |
| JP | 2002-094284 A | * | 3/2002 |
| JP | 2003-342424 A | * | 12/2003 |
| JP | 2004-224646 A | * | 8/2004 |
| JP | 2007-126524 A | * | 5/2007 |
| KR | 10-2006-0110386 A | * | 10/2006 |

OTHER PUBLICATIONS

Machine Translation of JP 2002-094284 A, provided by the JPO website (2002).*
Machine Translation of JP 2004-224646 A, provided by the JPO website (2004).*
Machine Translation of JP 2007-126524 A, provided by the JPO website (2007).*
Machine Translation of JP 2001-331181 A, provided by the JPO website (2001).*
Machine Translation of KR 10-2006-0110386 A, provided by the KIPO website (2006).*
Machine translation of JP 2003-342424 A, provided by the JPO website (no date).*
Machine translation of JP 2001-189590 A, provided by the JPO website (no date).*

* cited by examiner

*Primary Examiner*—Michael J Feely
(74) *Attorney, Agent, or Firm*—Rosenberg Klein & Lee

(57) ABSTRACT

An electromagnetic wave absorption material and a manufacturing method thereof are disclosed. Mix 40% to 70% weight percent liquid resin with 30% to 60% weight percent bamboo charcoal evenly. After cooling, pour the mixture into a mold for curing to produce sheet product. The microwave absorption material of the present invention meets environmental requirements.

7 Claims, 5 Drawing Sheets

ELECTROMAGNETIC WAVE ABSORPTION MATERIAL AND MANUFACTURING METHOD THEREOF

BACKGROUND OF THE INVENTION

The present invention relates to an electromagnetic wave absorption material and a manufacturing method thereof, especially to an electromagnetic wave absorption material having bamboo charcoal as dieletric loss material and a manufacturing method thereof.

In an industrial society, electrical appliances are essential to our daily lives. Household appliances such as fans, hair dryers, juicers, and microwave ovens all generate electromagnetic wave that is harmful to human health. For example, household alternative current frequency is 60 Hertz (Hz). AC power reverses direction 60 times per second. Thus direction of the magnetic filed changes 60 cycles per second. By making the magnetic field direction change, a current is induced to flow and this lead to damages of human bodies. As to mobile phones that virtually everyone has one also generates strong electromagnetic wave. For example, dial the mobile phone in front of computer screens or radio receivers, the computer screen flicker like crazy while the radio has a buzzing noise. Moreover, the microwave oven also generates strong electromagnetic wave. Thus absorption or shielding of electromagnetic wave has become an important issue.

Refer to Taiwanese patent No. 469283, a manufacturing method of dielectric electromagnetic wave absorption material is disclosed. Liquid polyurethane (PU) resin is added with conductive carbon black, carbon powder, conductive fiber, and microballoons and the mixture is stirred into syrupy and then is molded into microwave absorbing material. Refer to Taiwanese patent No. 567643, a modified Salisbury Screen having a conductive ground plane, a (low dielectric constant composite material formed by two kind of materials, and a reflective surface is disclosed. Refer to Taiwanese patent No. 566077, an electromagnetic wave absorption material consisting of 5-50 wt % multi-layer carbon nanocapsules and resin is disclosed. As to Taiwanese publication application No. 200605772, a crosslinked electromagnetic wave absorption material made by extrusion molding is disclosed. Refer to U.S. Pat. No. 6,465,098B2, an electromagnetic wave absorbing material made by shaping a resin composition containing 5 to 10 parts by weight of a carbon black and 1 to 10 parts by weight of a gas phase growth carbon fiber in a resin based on 100 parts by weight of the resin is provided.

However, the slurry of the dielectric electromagnetic wave absorption material in Taiwanese patent No. 469283 has high viscosity. Firstly, a special-designed 3000-6000 rpm high speed mill is used to mix part of carbon black with the resin and then carbon powder, conductive fiber, and microballoons are added so that the slurry becomes more and more sticky. Next a 300-600 rpm low-speed high viscosity mixer mixes the mixture evenly and then the mixture is coated on a test piece. The manufacturing processes and equipments are quite complicated and the used conductive fillers are environmental-unfriendly chemical compounds. The modified Salisbury Screen disclosed in Taiwanese patent No. 567643 is double-layer so that the manufacturing processes are more complicated than single-layer material. In U.S. Pat. No. 6,465,098B2, although the use of gas phase growth carbon fiber to replace conventional carbon fiber reduces amount of carbon black and carbon fiber being added, the conductive fillers are still not environmental friendly. In Taiwanese patent No. 566077, the multi-layer carbon nanocapsules added in resin also don't meet environmental concerns.

Bamboo charcoal is powder similar to carbon black or graphite and is made from bamboo sintered at high temperature. Due to features of deodorization, bacteria resistance, moisture absorbance and infra-redemitting, bamboo charcoal is broadly applied to daily accessories such as food, cloth and fabric. In the present invention, bamboo charcoal is used to replace chemical compounds such as conductive carbon black, carbon powder, conductive fiber and graphite for satisfying environmental requirements.

SUMMARY OF THE INVENTION

Therefore it is a primary object of the present invention to provide an electromagnetic wave absorption material and manufacturing method thereof that use bamboo charcoal for absorbing electromagnetic wave and the bamboo charcoal produces not pollution and meet environmental requirements.

It is another object of the present invention to provide an electromagnetic wave absorption material and manufacturing method thereof that provide simpler manufacturing processes with simple equipment by mixing liquid resin with bamboo charcoal to form simple structure device.

In order to achieve above objects, an electromagnetic wave absorption material and manufacturing method thereof according to the present invention uses a mixture of bamboo charcoal with liquid resin for absorbing electromagnetic wave. After being mixed, the mixture is matured to produce electromagnetic wave absorption material. Because the resin is liquid, the bamboo charcoal is easy to distribute well over the resin. The material of the present invention meets environmental requirements. Moreover, both the manufacturing processes and equipment are simpler than others.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
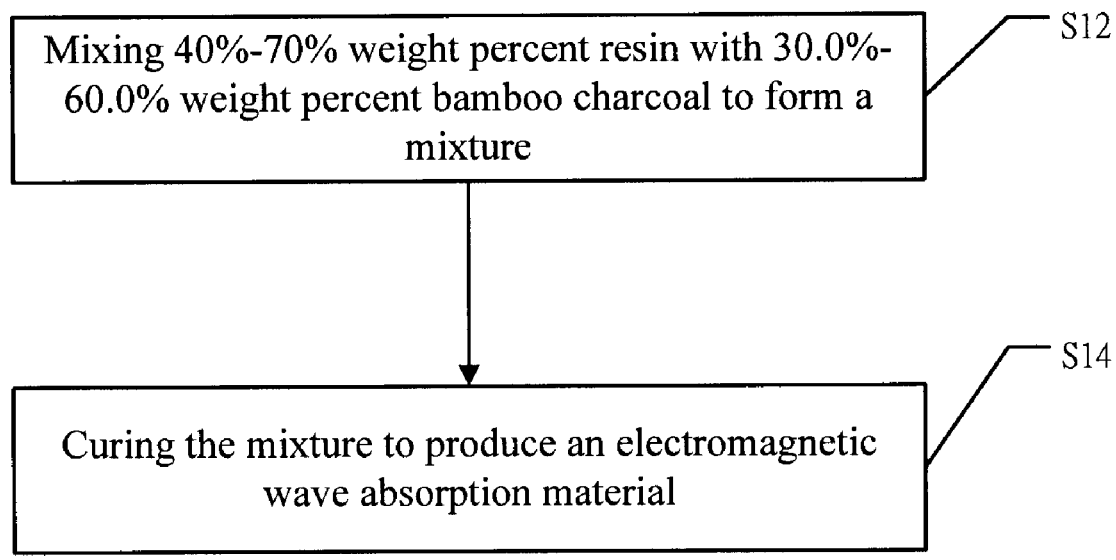
FIG. 1 is a flow chart of a manufacturing method of an electromagnetic wave absorption material according to the present invention.

There is no hollow glass bead (microballoon) in components of the present invention. Liquid resin is used as adhesive so as to mix each component easily and conductive material is replace by bamboo charcoal for satisfying all environmental requirements.

In the beginning, when electromagnetic wave transmits through the air to absorption material with conductive metal layer on rear side thereof, reflection coefficient of electromagnetic wave on interface between air and the absorption material is defined as following:

$$\rho = \frac{Z_2 \tanh(\gamma_2 d_2) - Z_1}{Z_2 \tanh(\gamma_2 d_2) + Z_1} \quad (1)$$

return loss dB is defined:

$$\rho(dB) = 10 \log(|\rho|^2) \quad (2)$$

wherein subscript 1 represents air, subscript 2 represents absorption material, ρ is reflection coefficient, ratio of reflection wave power with respect to an incident wave power, d2 is thickness of absorption material, $\gamma_2$ is propagation coefficient of electromagnetic wave in absorption material:

$$\gamma_2 = \sqrt{-w^2 \epsilon_2 \mu_2} \quad (3)$$

$Z_1$ and $Z_2$ respectively are resistance of air and absorption material:

$$Z_1 = Z_0 = \sqrt{\frac{\mu_0}{\varepsilon_0}} = 377 \, \Omega \quad (4)$$

$$Z_2 = \sqrt{\frac{\mu_2}{\varepsilon_2}} \quad (5)$$

∈ and ρ are dielectric constant and permeability of the material; in electromagnetic field, absorption material is polarized and there is time delay in response. That means there is a loss. Relative dielectric constant $\in_r$ of the absorption material to air and relative permeability $\mu_r$ of the absorption material to air are:

$$\varepsilon_r = \frac{\varepsilon_2}{\varepsilon_o} = \frac{\varepsilon'_2 - j\varepsilon''_2}{\varepsilon_o} = \varepsilon'_r - j\varepsilon''_r \quad (6)$$

$$\mu_r = \frac{\mu_2}{\mu_o} = \frac{\mu'_2 - j\mu''_2}{\mu_o} = \mu'_r - j\mu''_r \quad (7)$$

Once it's totally no reflection, the following equation is got from the equation (1)

$$Z_2 \tanh(\gamma_2 d_2) - Z_1 = 0 \quad (8)$$

Therefore, in order to get excellent absorption material, proper dieletric loss material and ferromagnetic material are selected and their amount and thickness should be controlled.

Refer to FIG. 1, a flow chart showing a manufacturing method of electromagnetic wave absorption material that includes at least following steps of:

step S12: mix resin with bamboo charcoal while weight percent of the resin ranges from 40% to 70% and weight percent of the bamboo charcoal is from 30.0% to 60.0%; and step S14: mature the mixture so as to get an electromagnetic wave absorption material.

The composition of the electromagnetic wave absorption material consists of 40 wt %-70 wt % resin and 30.0 wt %-60.0 wt % bamboo charcoal. The resin is selected form a group of epoxy, polyurethane resin, polymethacrylates, silicon resin and polyester resin. During manufacturing processes, liquid resin is used to improve mixing and uniformity.

The resin can be rubber that is selected from a group of natural rubber, polybutadiene rubber (butadiene rubber, BR), styrene-butadiene rubber (SBR), ethylene-propylene rubber, butyl rubber, chlorinated butyl rubber, chloroprene rubber, and silicone rubber. The bamboo charcoal is a compound with silicon, potassium, phosphorus, magnesium, calcium, iron, and aluminum while the preferred weight percent of the bamboo charcoal is 40.0%-55.0%.

Within 2-18 GHz, the electromagnetic wave absorption material with thickness ranging from 0.5 mm to 5.0 mm has at least return loss of 10 dB. The optimum thickness of the test piece is 1.0 mm-3.0 mm.

An electromagnetic wave absorption material according to the present invention includes liquid resin added with bamboo charcoal (made by Taiwan Paiho limited Co. Ltd., Product No, B2, with average particle diameter of 1.5 Microns). A general three-roller machine (roller clearance is 0.1 mm) is used to make the mixture become more homogeneous. The syrupy mixture is poured into a 15 cm×15 cm metal die with aluminum plates being clipped on top and bottom sides. The mixture in the die is heated at 80° C. for 2 hours. After cooling, the aluminum plates are removed and the product is released. After being trimmed, measure the thickness and weight of the product. Moreover, the rubber can be used as adhesive material and the bamboo charcoal is as filler. A double-roller machine is used to mix the mixture at least 10 to 20 times and then the mixture is sheeting by a calender to produce rubber sheets. The rubber sheet is cut to necessary size and is pressured for curing. After being trimmed, the cut piece that absorbs electromagnetic wave is obtained.

The way to measure return loss is by free space method. The frequency ranges from 2 to 18 GHz. The microwave network analyzer HP 8722ES and free space setups of Damaskos, Inc. are used. A 15 cm×15 cm test piece is set, make the level to be emendated, and adjust incident angle (21 o) of the antenna for measuring original reflection. Then replace the test piece and the metal piece is used as reflection surface and return loss of the test piece is measured again.

List 1: specification of the electromagnetic wave absorption material according to the present invention

| item | source | specification (average particle diameter) |
|---|---|---|
| bamboo charcoal (Product No, B2) | Taiwan Paiho limited Co. Ltd. | 1.5 Microns |
| carbon black (Vulcan XC-72) | Cabot Corp. | 30 nm |

Embodiment One

Figure 2:
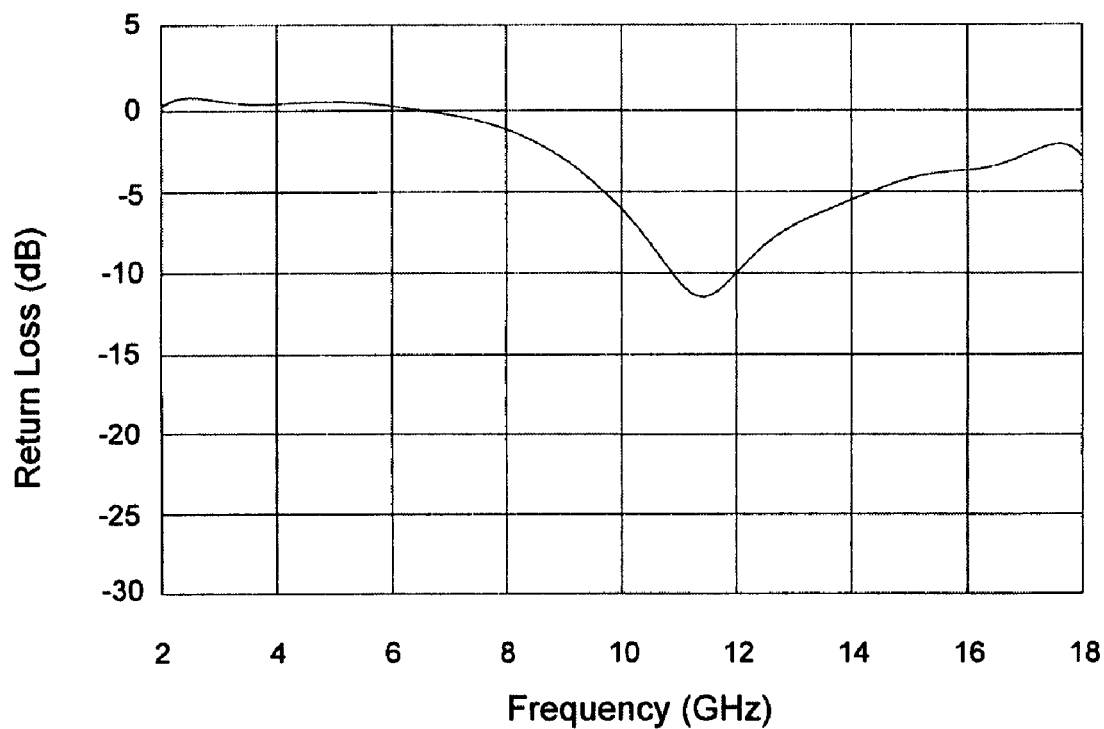
FIG. 2 shows the return loss at specific frequencies of an embodiment according to the present invention.

Put 60.0 g liquid epoxy resin and 40.0 g bamboo charcoal into a 250 ml mixing container. The total weight is 100 g. The following embodiments also have the same total weight of 100 g. Use a stirrer to stir for 1-2 minutes. Then a general three-roller machine is used to mix the mixture for 5 times so that the syrupy mixture is mixed evenly. Take 58.0 g syrupy mixture and pour it into a 15 cm×15 cm metal die. After curing, release a test piece. After being trimmed, the weight of the test piece is 52.6 g and the thickness is 2.0 mm. The weight per unit area is 2.3 Kg/m×m. As shown in FIG. 2, peak of the return loss is 11.5 dB at 11.4 GHz.

Embodiment Two

Figure 3:
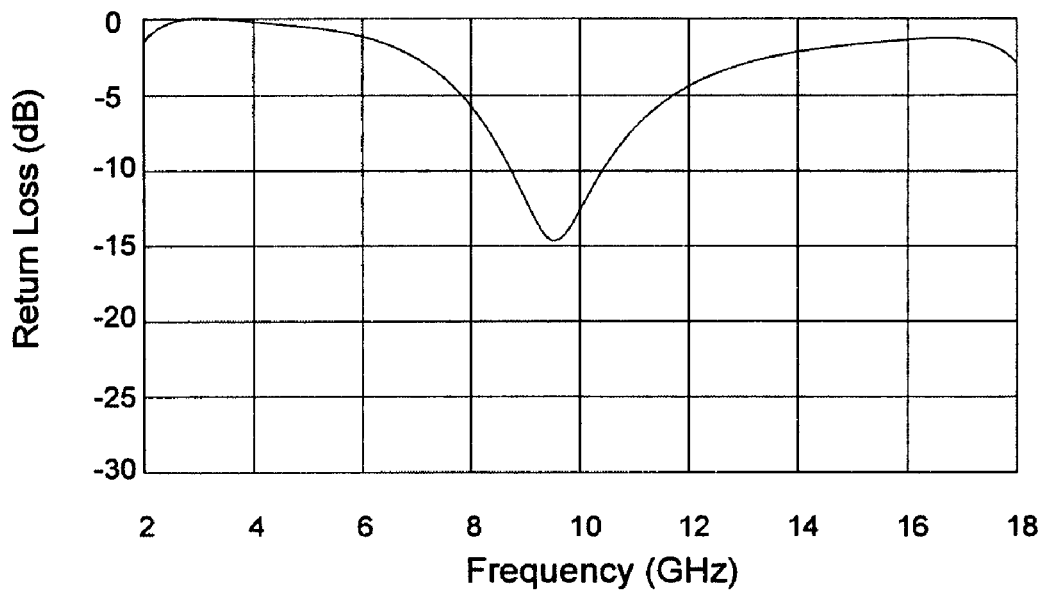
FIG. 3 shows the return loss at specific frequencies of another embodiment according to the present invention.

Put 50.0 g liquid epoxy resin and 50.0 g bamboo charcoal into a 250 ml mixing container. A stirrer is used to stir the mixture for 1-2 minutes. Then a three-roller machine is used to mix the mixture for 5 times so that the syrupy mixture is mixed evenly. Take 59.0 g slurry mixture and pour it into a 15 cm×15 cm metal die. After curing, release a test piece. After being trimmed, the weight of the test piece is 57.0 g and the thickness is 2.0 mm. The weight per unit area is 2.5 Kg/m×m. As shown in FIG. 3, peak of the return loss is 14.5 dB at 9.5 GHz.

Embodiment Three

Figure 4:
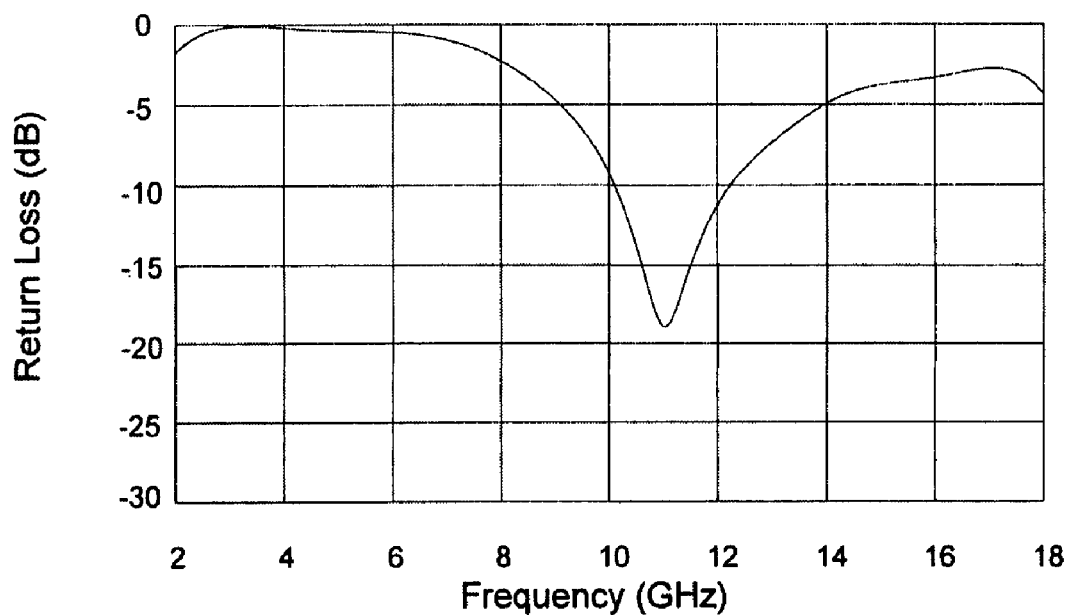
FIG. 4 shows the return loss at specific frequencies of a further embodiment according to the present invention.

The same components and manufacturing method as the embodiment two are used. Take 50.0 g slurry mixture into a mold and get a test piece after curing. The weight of the test piece is 48.8 g and the thickness is 1.7 mm. The weight per unit area is 2.1 Kg/m×m. As shown in FIG. 4, peak of the return loss is 19.0 dB at 11.1 GHz.

Embodiment Four

Figure 5:
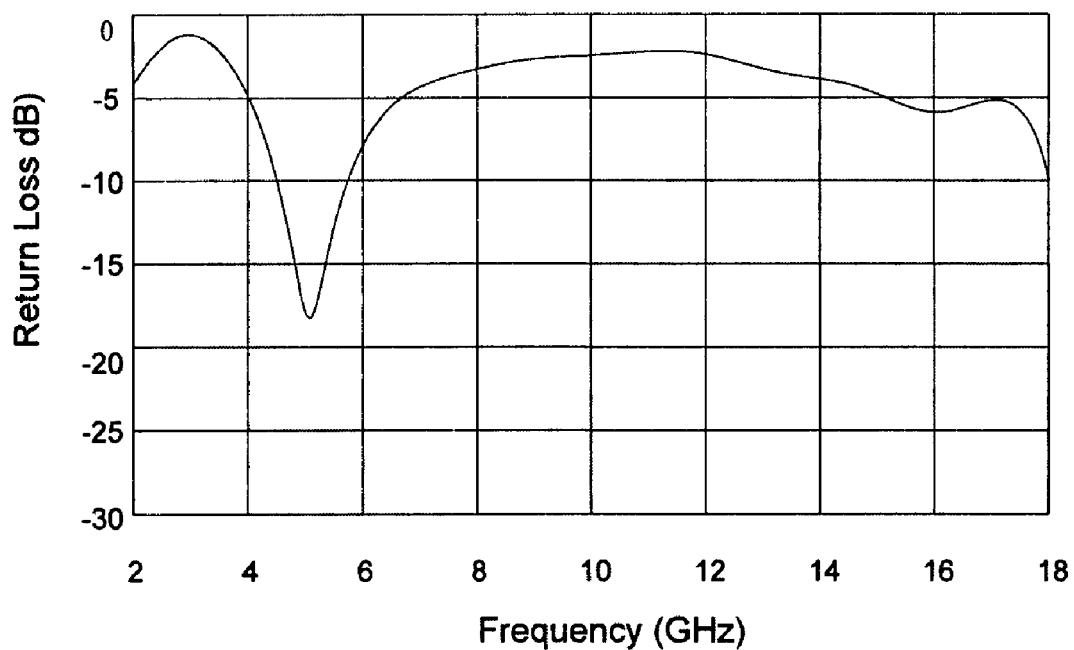
FIG. 5 shows the return loss at specific frequencies of a further embodiment according to the present invention.

Put 45.0 g liquid epoxy resin and 55.0 g bamboo charcoal into a 250 ml mixing container. A stirrer is used to stir the mixture for 1-2 minutes. Then a three-roller machine is used to mix the mixture for 5 times so that the slurry mixture is mixed evenly. Take 93.0 g slurry mixture and pour it into a 15 cm×15 cm metal die. After curing, release a test piece. The weight of the test piece is 89.7 g and the thickness is 3.0 mm. The weight per unit area is 4.0 Kg/m×m. As shown in FIG. 5, peak of the return loss is 18.0 dB at 5.2 GHz.

Embodiment Five

Figure 6:
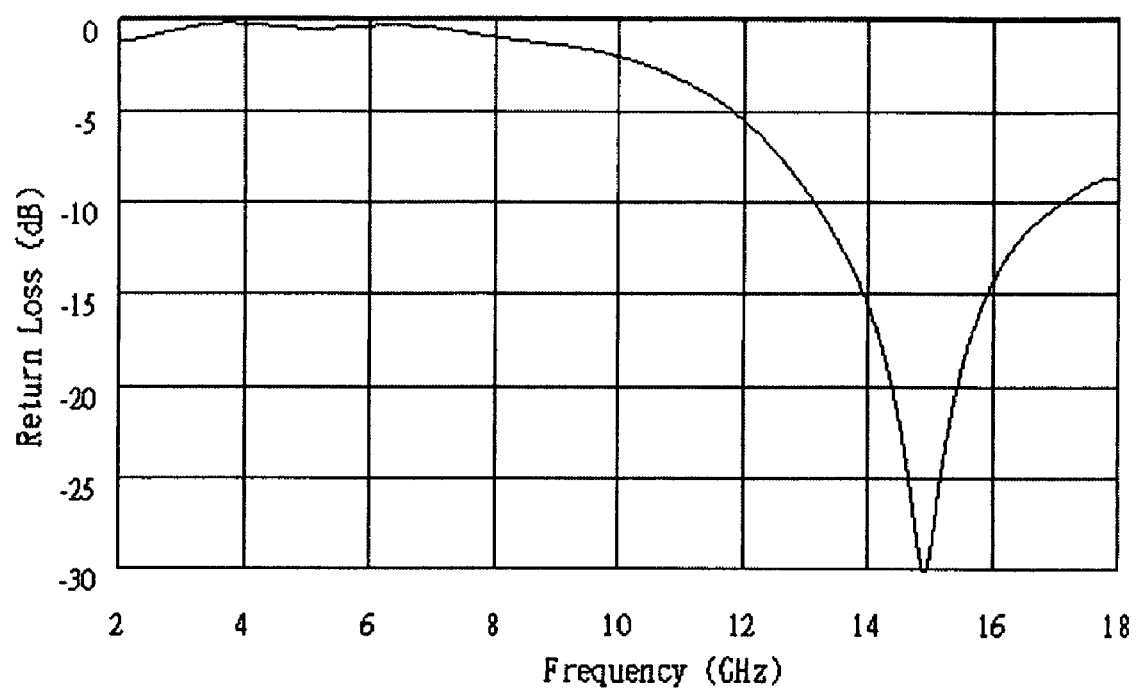
FIG. 6 shows the return loss at specific frequencies of a further embodiment according to the present invention.

The same components and manufacturing method as the embodiment fourth are used. Take 31.0 g slurry mixture into a mold and get a test piece after curing. The weight of the test piece is 29.4 g and the thickness is 1.0 mm. The weight per unit area is 1.3 Kg/m×m. As shown in FIG. 6, peak of the return loss is 30.0 dB at 15.0 GHz.

Control Embodiment

Figure 7:
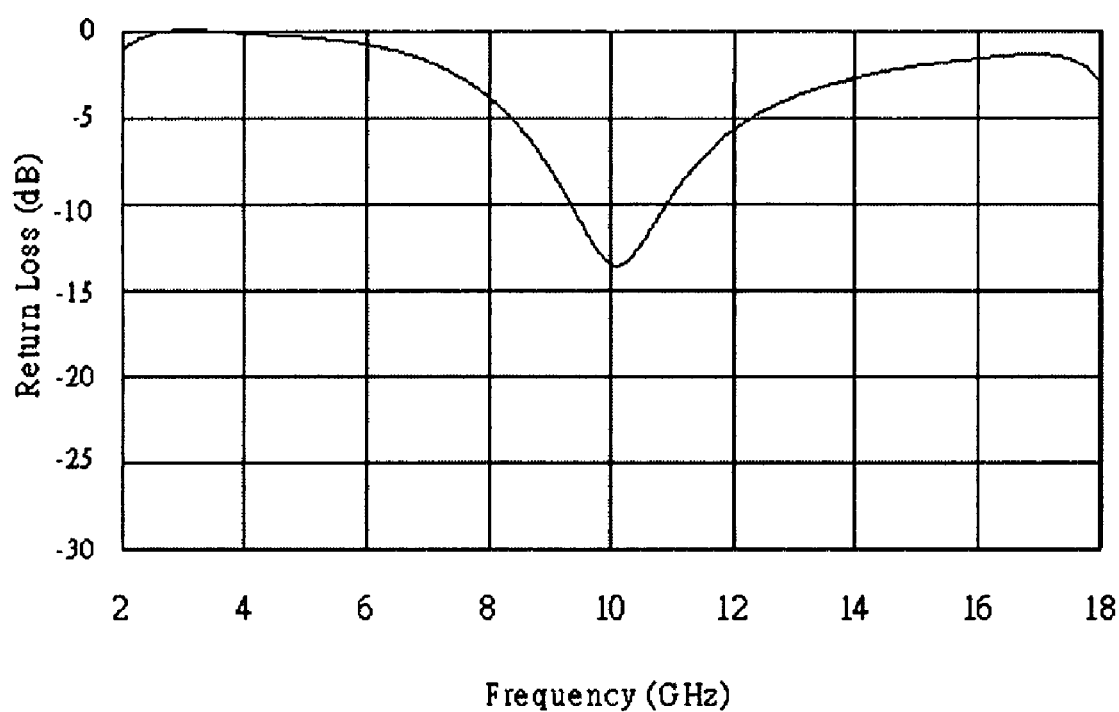
FIG. 7 shows the return loss at specific frequencies of a control embodiment according to the present invention.

Put 85.0 g liquid epoxy resin and 15.0 g carbon black (Cabot Corp., Vulcan XC-72) into a 250 ml mixing container. A stirrer is used to stir the mixture for 1-2 minutes. Then a three-roller machine is used to mix the mixture for 5 times so that the slurry mixture is mixed evenly. Take 60.0 g slurry mixture and pour it into a 15 cm×15 cm metal die. After curing, release a test piece. The weight of the test piece is 55.0 g and the thickness is 2.0 mm after being trimmed. The weight per unit area is 2.4 Kg/m×m. As shown in FIG. 7, peak of the return loss is 13.5 dB at 10.1 GHz.

Compare the control embodiment with the embodiment two of the present invention, the thickness of them is the same-2.0 mm with similar peak value and dB value of return loss. In the control embodiment, all raw materials are artificial compounds while the embodiment includes 50 wt % biomass material-bamboo charcoal. Thus the electromagnetic wave absorption material of the present invention is obviously able to cope with environmental requirements.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electromagnetic wave absorption material comprising a cured product of a sheeted bamboo charcoal mixture, said bamboo charcoal mixture consisting of:
    40% to 70% by weight of a curable rubber material; and
    30% to 60% by weight of a bamboo charcoal.
2. The electromagnetic wave absorption material as claimed in claim 1, wherein the curable rubber material is selected from the group consisting of natural rubber, polybutadiene rubber, styrene butadiene rubber, ethylene-propylene rubber, butyl rubber, chlorinated butyl rubber, chloroprene rubber, and silicone rubber.
3. The electromagnetic wave absorption material as claimed in claim 1, wherein said bamboo charcoal mixture consists of:
    45% to 60% by weight of said curable rubber material; and
    40% to 55% by weight of said bamboo charcoal.
4. The electromagnetic wave absorption material as claimed in claim 1 having a thickness of from 0.5 mm to 5.0 mm.
5. The electromagnetic wave absorption material as claimed in claim 1 having a thickness of from 1.0 mm to 3.0 mm.
6. A manufacturing method of electromagnetic wave absorption material comprising the steps of:
    mixing a curable rubber material with a bamboo charcoal, yielding a bamboo charcoal mixture consisting of: 40%-70% by weight of said curable rubber material; and 30%-60% by weight of said bamboo charcoal;
    sheeting the bamboo charcoal mixture; and
    curing the sheeted bamboo charcoal mixture.
7. The method as claimed in claim 6, wherein curing is performed by pressing the sheeted bamboo charcoal mixture.

* * * * *